United States Patent
Zhai et al.

(10) Patent No.: US 9,236,355 B2
(45) Date of Patent: Jan. 12, 2016

(54) EMI SHIELDED WAFER LEVEL FAN-OUT POP PACKAGE

(71) Applicant: Apple Inc., Cupertino, CA (US)

(72) Inventors: Jun Zhai, San Jose, CA (US); Mengzhi Pang, Cupertino, CA (US); Se Young Yang, San Jose, CA (US); Leland W. Lew, Los Altos, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/331,363

(22) Filed: Jul. 15, 2014

(65) Prior Publication Data

US 2015/0303149 A1    Oct. 22, 2015

Related U.S. Application Data

(60) Provisional application No. 61/980,830, filed on Apr. 17, 2014.

(51) Int. Cl.
*H01L 23/60* (2006.01)
*H01L 23/538* (2006.01)
(Continued)

(52) U.S. Cl.
CPC .......... *H01L 23/552* (2013.01); *H01L 23/3675* (2013.01); *H01L 24/17* (2013.01); *H01L 24/81* (2013.01); *H01L 25/0652* (2013.01); *H01L 25/18* (2013.01); *H01L 25/50* (2013.01); *H01L 2224/16145* (2013.01); *H01L 2224/16225* (2013.01); *H01L 2224/32245* (2013.01); *H01L 2225/06513* (2013.01); *H01L 2225/06517* (2013.01); *H01L 2225/06589* (2013.01); *H01L 2924/01029* (2013.01); *H01L 2924/1434* (2013.01)

(58) Field of Classification Search
None
See application file for complete search history.

(56) References Cited

U.S. PATENT DOCUMENTS 7,443,693 B2   10/2008   Arnold et al.
8,653,633 B2 *   2/2014   Liao et al. ..................... 257/659
(Continued)

OTHER PUBLICATIONS

Das. R., et. al., Package-Interposer-Package (PiP): A Breakthrough Package on Package (PoP) Technology for 3D Integration. 45th International Symposium of Microelectronics, San Diego Sep. 9-13, 20012.*

(Continued)

*Primary Examiner* — Joseph Schoenholtz
(74) *Attorney, Agent, or Firm* — Meyertons, Hood, Kivlin, Kowert & Goetzel P.C.; Lawrence J. Merkel; Neal E. Persky

(57) ABSTRACT

In some embodiments, a semiconductor device package assembly may include a first substrate. The first substrate may include a first set of electrical conductors which electrically connect the assembly. In some embodiments, the assembly may include at least one electrical conductor coupled to the first substrate such that at least one of the electrical conductors exposes through a perimeter surface of the semiconductor device package assembly. In some embodiments, the assembly may include a first die electrically connected to a second surface of the first substrate using a second set of electrical conductors. The assembly may include an electronic memory module coupled to the first die. In some embodiments, the assembly may include a shield applied to an upper surface of the assembly and electrically coupled to at least one of the exposed electrical conductors. The shield may inhibit, during use, electromagnetic interference.

17 Claims, 5 Drawing Sheets

(51) Int. Cl.
  *H01L 23/485* (2006.01)
  *H01L 23/552* (2006.01)
  *H01L 25/00* (2006.01)
  *H01L 25/065* (2006.01)
  *H01L 25/18* (2006.01)
  *H01L 23/00* (2006.01)
  *H01L 23/367* (2006.01)

(56) References Cited

U.S. PATENT DOCUMENTS

| | | | |
|---|---|---|---|
| 2009/0014847 A1 | 1/2009 | Chen et al. | |
| 2009/0168386 A1 | 7/2009 | Suzuki et al. | |
| 2009/0184414 A1* | 7/2009 | Park et al. | 257/698 |
| 2010/0252937 A1* | 10/2010 | Uchiyama | 257/777 |
| 2011/0006408 A1* | 1/2011 | Liao | 257/660 |
| 2011/0260301 A1* | 10/2011 | Liao et al. | 257/659 |
| 2012/0139090 A1 | 6/2012 | Kim et al. | |
| 2013/0082368 A1* | 4/2013 | Kim et al. | 257/659 |
| 2015/0061095 A1* | 3/2015 | Choi et al. | 257/675 |

OTHER PUBLICATIONS

Xiaofeng Sun; Lixi Wan; Yuan Lu, "Fabrication and reliability evaluation of a novel package-on-package (PoP) structure based on organic substrate," Electronic Components and Technology Conference (ECTC), 2014 IEEE 64th pp. 1354,1360, May 27-30, 2014.*

Xie, J. "Interposer Integration through Chip on Wafer on Substrate Process CoWoS" Semicon West, Jul. 10-12, 2012.*

Yuan, T.D. et al., "Thermal Interface Material (TIM) Design Guidance for Flip Chip BGA Package Thermal Performance", Oct. 2004, www.altera.com/literature/cp/cp-01020. downloaded from URL < http://citeseerx.ist.psu.edu/viewdoc/download?doi=10.1.1.192.2336&rep=rep1&type=pdf on Mar. 31, 2015.*

* cited by examiner

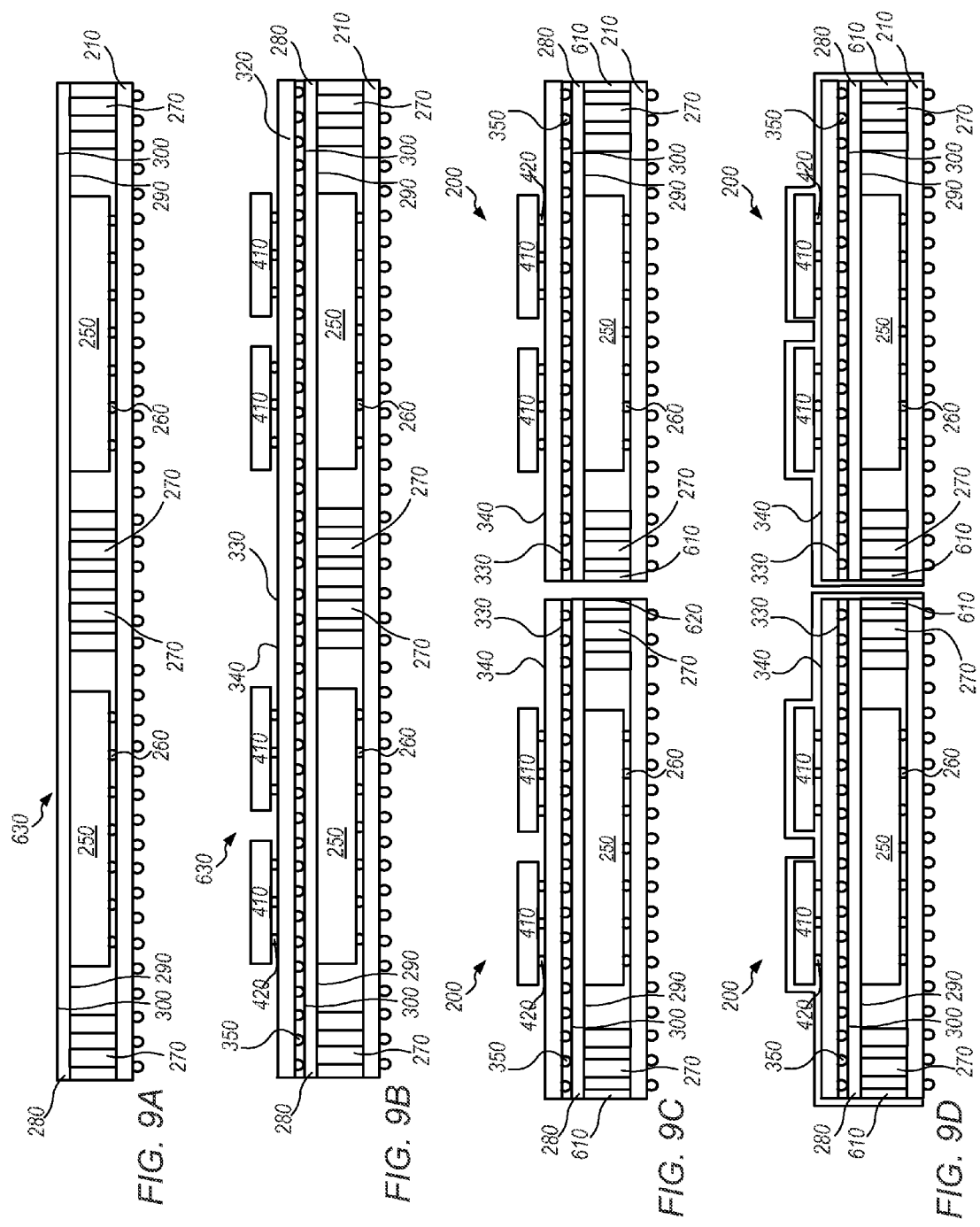

EMI SHIELDED WAFER LEVEL FAN-OUT POP PACKAGE

PRIORITY CLAIM

This application claims priority to U.S. Provisional Patent Application No. 61/980,830 entitled "EMI SHIELDED WAFER LEVEL FAN-OUT POP PACKAGE" to Zhai et al. filed on Apr. 17, 2014, all of which is incorporated by reference herein.

BACKGROUND

1. Technical Field

Embodiments described herein relate to semiconductor packaging and methods for packaging semiconductor devices. More particularly, some embodiments disclosed herein relate to shielding package-on-package ("PoP") from electromagnetic interference.

2. Description of the Related Art

Package-on-package ("PoP") technology has become increasingly popular as the demand for lower cost, higher performance, increased integrated circuit density, and increased package density continues in the semiconductor industry. As the push for smaller and smaller packages increases, the integration of die and package (e.g., "pre-stacking" or the integration of system on a chip ("SoC") technology with memory technology) allows for thinner packages. Such pre-stacking has become a critical component for thin and fine pitch PoP packages. FIG. 1 depicts an embodiment of a current package on package format 100. Package 100 may include several air gaps 110 which are formed within the package during manufacture. However, air is known as a very good insulator and as such results in poor thermal conduction between the components of the package.

EMI ("electromagnetic interference") is the unwanted effects in the electrical system due to electromagnetic radiation and electromagnetic conduction. Electromagnetic radiation and electromagnetic conduction are different in the way an EM field propagates. Conducted EMI is caused by the physical contact of the conductors as opposed to radiated EMI which is caused by induction. Electromagnetic disturbances in the EM field of a conductor will no longer be confined to the surface of the conductor and may radiate away from it. Mutual inductance between two radiated electromagnetic fields may result in EMI.

Due to EMI, the electromagnetic field around the conductor is no longer evenly distributed (e.g., resulting in skin effects, proximity effects, hysteresis losses, transients, voltage drops, electromagnetic disturbances, EMP/HEMP, eddy current losses, harmonic distortion, and reduction in the permeability of the material).

EMI can be conductive and/or radiative and its behavior is dependent on the frequency of operation and cannot be controlled at higher frequencies. For lower frequencies, EMI is caused by conduction (e.g., resulting in skin effects) and, for higher frequencies, by radiation (e.g., resulting in proximity effects).

A high frequency electromagnetic signal makes every conductor an antenna, in the sense that they can generate and absorb electromagnetic fields. In the case of a printed circuit board ("PCB"), consisting of capacitors and semiconductor devices soldered to the board, the capacitors and soldering function like antennas, generating and absorbing electromagnetic fields. The chips on these boards are so close to each other that the chances of conducted and radiated EMI are significant. Boards are designed in such a way that the case of the board is connected to the ground and the radiated EMI is typically diverted to ground. Technological advancements have drastically reduced the size of chipboards and electronics; however, this means they are also much more sensitive to EMI. Typically electromagnetic shielding is used to inhibit EMI effects. However, EMI shielding can be expensive and may have negative consequences.

SUMMARY

In some embodiments, an EMI self-shielded wafer level PoP structure is provided that provides high EMI shield effectiveness. In some embodiments, EMI self-shielding may be achieved by coating conductive material over the surface of the PoP package. The coating material may be applied by processes such as sputter/CVD/spray/etc. The high electrically conductive coating layer may consist of multiple layers having high permeability difference between adjacent layers that enhance EMI attenuation and reflectance. The shielding layer may be electrically connected to a redistribution layer, ground terminals, vias, or traces that are engineered to be exposed at the package side surface. In some embodiments, a metal lid applied on top of PoP for thermal enhancement purpose may be partially or fully connected to the shielding layer, and further enhances EMI shielding performance.

In some embodiments, a semiconductor device package assembly may include a first substrate. The first substrate may include a first surface and a second surface substantially opposite of the first surface. The first substrate may include a first set of electrical conductors coupled to the first surface. The first set of electrical conductors may function to electrically connect the semiconductor device package assembly. The first surface may be equivalent a lower surface of the semiconductor device package assembly. In some embodiments, the semiconductor device package assembly may include at least one electrical conductor. The electrical conductor may be electrically coupled to the first substrate. The electrical conductor may be such that at least one of the electrical conductors exposes through a perimeter surface of the semiconductor device package assembly. In some embodiments, the semiconductor device package assembly may include a first die. The first die may be electrically connected to the second surface of the first substrate using a second set of electrical conductors. In some embodiments, the semiconductor device package assembly may include an electronic memory module coupled to the first die. In some embodiments, the semiconductor device package assembly may include a shield. The shield may be applied to an upper surface of the semiconductor device package assembly. The shield may be electrically coupled to at least one of the exposed electrical conductors. The shield may inhibit, during use, electromagnetic interference.

BRIEF DESCRIPTION OF THE DRAWINGS

The following detailed description makes reference to the accompanying drawings, which are now briefly described.

FIGS. 9A-D depict an embodiment of an assembly of several package on package formats including EMI shields.

Figure 1:
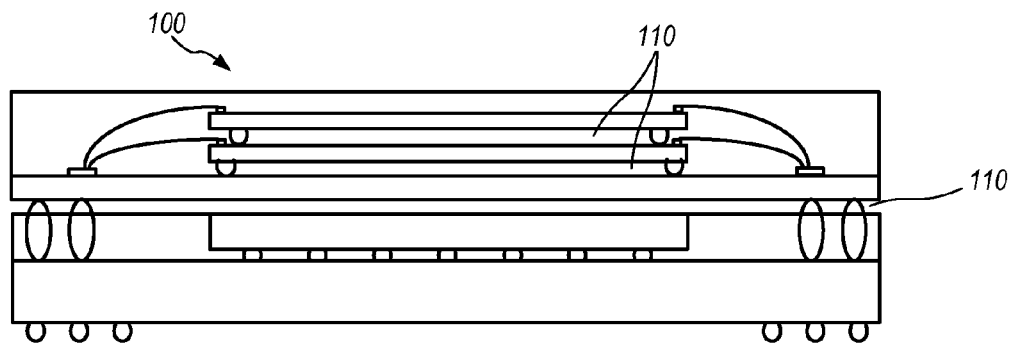
FIG. 1 depicts an embodiment of a current package on package format.

Specific embodiments are shown by way of example in the drawings and will be described herein in detail. It should be understood, however, that the drawings and detailed description are not intended to limit the claims to the particular embodiments disclosed, even where only a single embodiment is described with respect to a particular feature. On the contrary, the intention is to cover all modifications, equivalents and alternatives that would be apparent to a person skilled in the art having the benefit of this disclosure. Examples of features provided in the disclosure are intended to be illustrative rather than restrictive unless stated otherwise.

The headings used herein are for organizational purposes only and are not meant to be used to limit the scope of the description. As used throughout this application, the word "may" is used in a permissive sense (i.e., meaning having the potential to), rather than the mandatory sense (i.e., meaning must). The words "include," "including," and "includes" indicate open-ended relationships and therefore mean including, but not limited to. Similarly, the words "have," "having," and "has" also indicated open-ended relationships, and thus mean having, but not limited to. The terms "first," "second," "third," and so forth as used herein are used as labels for nouns that they precede, and do not imply any type of ordering (e.g., spatial, temporal, logical, etc.) unless such an ordering is otherwise explicitly indicated. For example, a "third die electrically connected to the module substrate" does not preclude scenarios in which a "fourth die electrically connected to the module substrate" is connected prior to the third die, unless otherwise specified. Similarly, a "second" feature does not require that a "first" feature be implemented prior to the "second" feature, unless otherwise specified.

Various components may be described as "configured to" perform a task or tasks. In such contexts, "configured to" is a broad recitation generally meaning "having structure that" performs the task or tasks during operation. As such, the component can be configured to perform the task even when the component is not currently performing that task (e.g., a set of electrical conductors may be configured to electrically connect a module to another module, even when the two modules are not connected). In some contexts, "configured to" may be a broad recitation of structure generally meaning "having circuitry that" performs the task or tasks during operation. As such, the component can be configured to perform the task even when the component is not currently on. In general, the circuitry that forms the structure corresponding to "configured to" may include hardware circuits.

Various components may be described as performing a task or tasks, for convenience in the description. Such descriptions should be interpreted as including the phrase "configured to." Reciting a component that is configured to perform one or more tasks is expressly intended not to invoke 35 U.S.C. §112 paragraph (f), interpretation for that component.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

DETAILED DESCRIPTION OF EMBODIMENTS

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Figure 2:
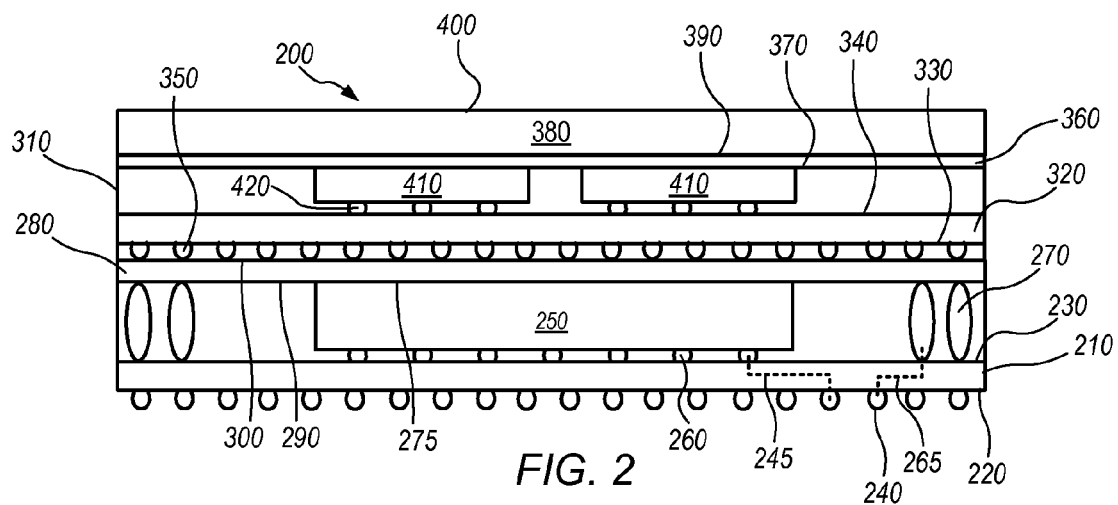
FIG. 2 depicts an embodiment of a thermally enhanced package on package format including two redistribution layers. At least some of the electrical conductors are not depicted for the sake of clarity.

FIG. 2 depicts an embodiment of a thermally enhanced package on package format 200 including two redistribution layers. At least some of the electrical conductors are not depicted for the sake of clarity. In some embodiments, a semiconductor device package assembly 200 may include a first substrate 210 (or a first redistribution layer) including a first surface 220, a second surface 230 substantially opposite of the first surface, and a first set of electrical conductors 240 coupled to the first surface. The first set of electrical conductors may function to electrically connect the semiconductor device package assembly to, for example, other electrical components. The semiconductor device package assembly may include a first die 250 electrically connected to the second surface of the first substrate using a second set of electrical conductors 260 such that the first die is directly bonded to the first substrate. The second set of electrical conductors may function to electrically connect 245 to at least some of the first set of electrical conductors through the redistribution layer 210. The semiconductor device package assembly may include a third set of electrical conductors 270 coupled to the second surface of the first substrate. The third set of electrical conductors may function to electrically connect 265 to at least some of the first set of electrical conductors 240 and/or to the second set of electrical connectors 260, through the redistribution layer 210. The semiconductor device package assembly may include a second substrate (or second redistribution layer) 280 including a first surface 290 and a second surface 300 substantially opposite of the first surface. The first surface may be directly bonded to a surface 275 of the first die opposite the second set of electrical conductors. The semiconductor device package assembly may include an electronic memory module 310. The electronic memory module may include a third substrate (or third redistribution layer) 320 including a first surface 330 and a second surface 340 substantially opposite of the first surface. The first surface may be directly bonded to the second surface of the second substrate using a fourth set of electrical conductors 350. The second surface may be coupled to a fifth set of conductors 420 on the second die 410.

Generally, the redistribution layers 210, 280, and 320 may include conductors and electrically insulating material to form connections between conductors bonded to the top surface of the redistribution layer and conductors bonded to the bottom surface of the redistribution layer. That is, the redistribution layer may provide connection between conductors that are not vertically aligned with each other (although vertically aligned connections may also be made). Since the redistribution layers include metal conductors, they may also be efficient heat conductors as well. The redistribution layers may also serve as substrates for carrying the various semiconductor die 250 and 410, providing structure as well, in the illustrated embodiments. Other embodiments may include other types of substrates as desired.

Each of the die 250 and 410 may be encapsulated using any suitable encapsulant. The encapsulant may protect the die and provide structural stability.

The semiconductor device package assembly may include a thermally conductive material 360 directly applied to a second surface 370 of the electronic memory module. The semiconductor device package assembly may include a heat spreader 380 including a first side 390 and a second side 400 substantially opposite the first side. The first side may be directly bonded to the thermally conductive material. The heat spreader may function to transfer heat from the first die and the electronic memory module through the heat spreader from the first side to the second side.

The heat spreader may function as a heat exchanger that moves heat between a heat source, and a secondary heat exchanger whose surface area and geometry are more favorable than the source. Such a spreader is most often simply a plate made of copper, which has a high thermal conductivity. In some embodiments, if height is not an issue, and heat spreader may further include a heat sink (e.g. fins to conduct the heat into the air or the like).

Heat spreaders transfer heat from electronic components to passive or active heat sinks. Typically they are used to cool chips in personal computers, laptops, notebooks, cell phones, and other electronic devices. Heat spreaders are used in critical locations for more efficient heat removal. Heat spreaders may be used to reduce electrical component hot spots, such that the component's lifetime is increased and the component's performance is improved.

In some embodiments, the heat spreader may provide structural stability to the package assembly. The cover may be formed from, for example, copper, aluminum alloys, high thermal conductivity ceramics, composite graphite, etc.

Directly bonding the different layers of the package directly to one another substantially removes any air gaps in the package relative to the configuration illustrated in FIG. 1. In some embodiments, substantially no air gap is present between the electronic memory module and the second substrate. In some embodiments, heat travels from the first die to the heat spreader without traversing an air gap. In the current embodiments described herein have significantly improved thermal resistance compared to packages produced with air gaps.

Figure 3:
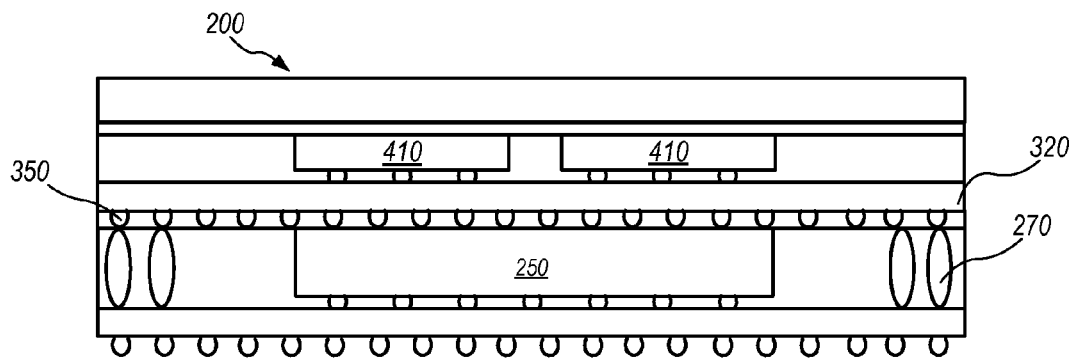
FIG. 3 depicts an embodiment of a thermally enhanced package on package format including one redistribution layer. At least some of the electrical conductors are not depicted for the sake of clarity.

Directly bonding layers of the package together may result in low profile (e.g., Z height<1 mm) packages. Z height may be reduced by using fan out configurations for one or more components of the package. For example, the electronic memory module 310 may include two or more die 410 (e.g., as depicted in FIGS. 2-3) in what is commonly known as a fan out configuration. In some embodiments, first and/or second die may be coupled as flip chip configurations.

FIG. 3 depicts an embodiment of a thermally enhanced package on package format 200 including one redistribution layer. At least some of the electrical conductors are not depicted for the sake of clarity. In some embodiments, the package may include only one redistribution layer. For example, as depicted in FIG. 3 the package 200 may not include a second substrate 280. In such an embodiment fourth set of electrical conductors 350 may be directly bonded to the first die 250 and the third set of conductors 270. Those conductors 350 that are connected to conductors 270 may be used for signal and power/ground interconnect. Those conductors 350 that contact the die 250 may not be used electrically (e.g. they may be "no connects" in the redistribution layer 320), but they may provide a low thermal resistance path for heat from the die 250.

Each of the conductors 240, 260, 270, 350, and 420 may be formed in any desired fashion. For example, in an embodiment, the conductors 260 and 420 may be controlled-collapse chip connect (C4) bumps deposited as part of the manufacturing process for the die 250 and 410. The conductors 240, 270, and 350 may be ball grid array (BGA) solder balls. Other conductors may be used as desired.

In some embodiments, the electronic memory module may include at least one second die electrically connected to the second surface of the third substrate. The second die may electrically connect the second surface using a fifth set of electrical conductors such that the second die is directly bonded to the third substrate.

Figure 4:
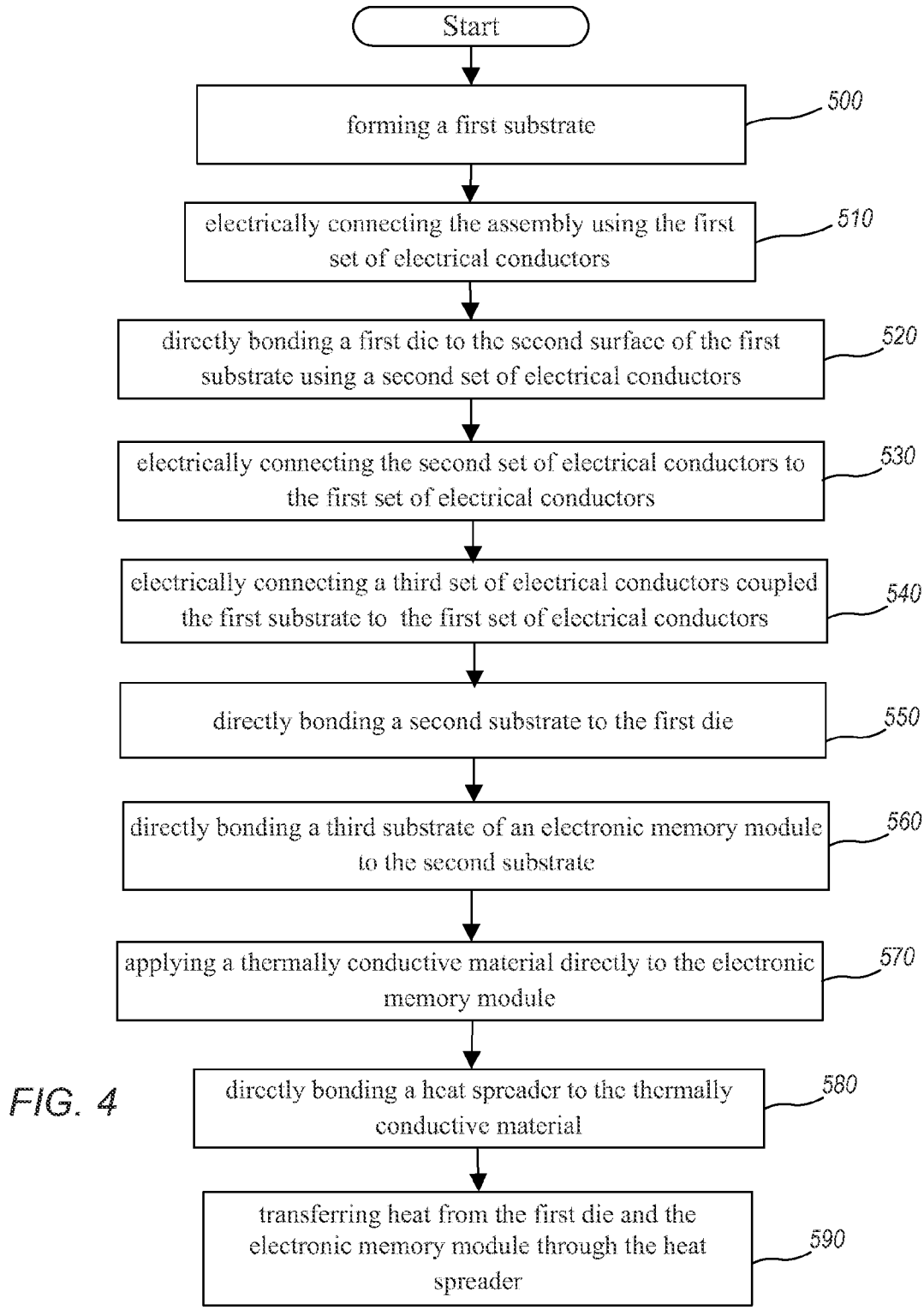
FIG. 4 depicts an embodiment of flow chart representing a method of forming at least a portion of a thermally enhanced package on package format.
Figure 5A:
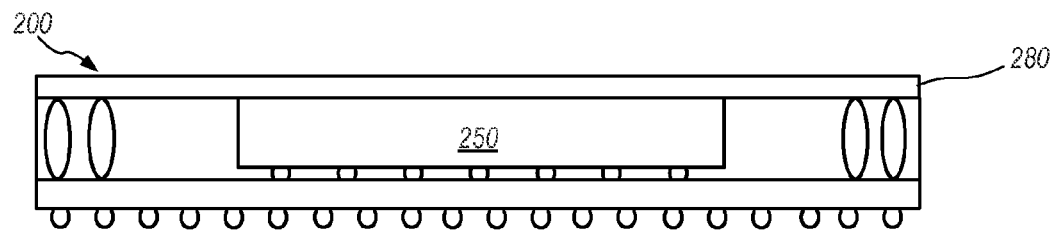
FIGS. 5A-D depict an embodiment of an assembly of several thermally enhanced package on package formats.
Figure 5B:
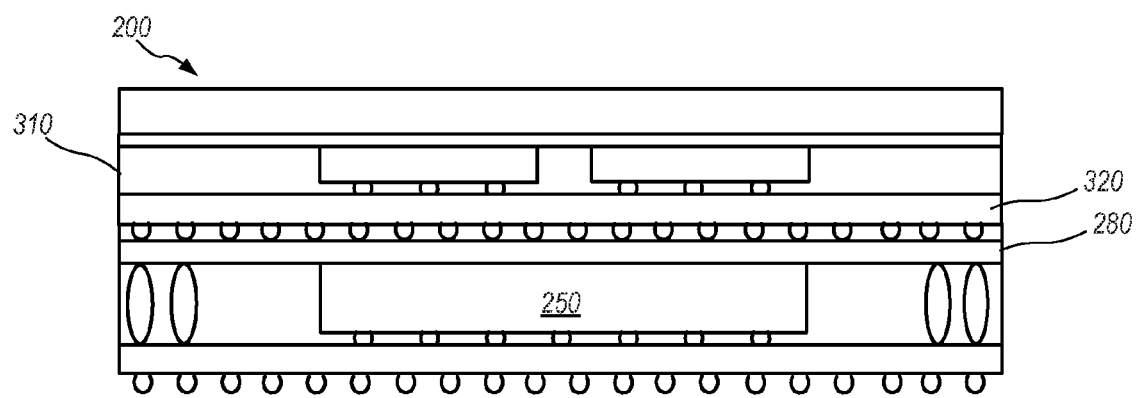

In some embodiments, the method may include forming a semiconductor device package assembly. FIG. 4 depicts an embodiment of flow chart representing a method of forming at least a portion of a thermally enhanced package on package format. FIGS. 5A-D depict an embodiment of an assembly of several thermally enhanced package on package formats 200. The method may include forming 500 a first substrate. The method may include electrically connecting the semiconductor device package 510. The method may include directly bonding 520 a first die to the first substrate using a second set of electrical conductors. The method may include electrically connecting 530 the second set of electrical conductors to the first set of electrical conductors. The method may include electrically connecting 540 a third set of electrical conductors coupled the first substrate to the first set of electrical conductors. The method may include directly bonding 550 a second substrate 280 to the first die 250 (e.g., as depicted in FIG. 5A). The method may include directly bonding 560 a third substrate 320 forming at least a portion of an electronic memory module 310 to the second substrate 280 (e.g., as depicted in FIG. 5B). The method may include applying 570 a thermally conductive material directly to a second surface of the electronic memory module. The method may include directly bonding 580 a first side of a heat spreader to the thermally conductive material, wherein the heat spreader comprises a second side substantially opposite the first side. The method may include transferring 590 heat from the first die and the electronic memory module through the heat spreader from the first side to the second side of the heat spreader.

Figure 5C:
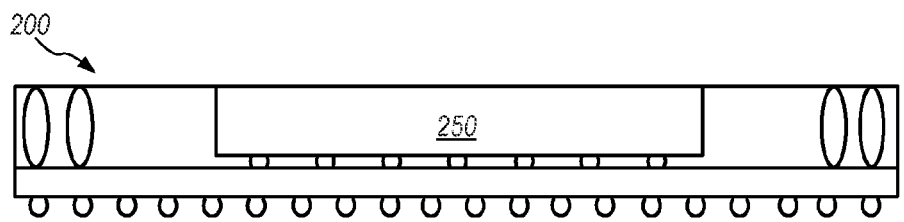
Figure 5D:
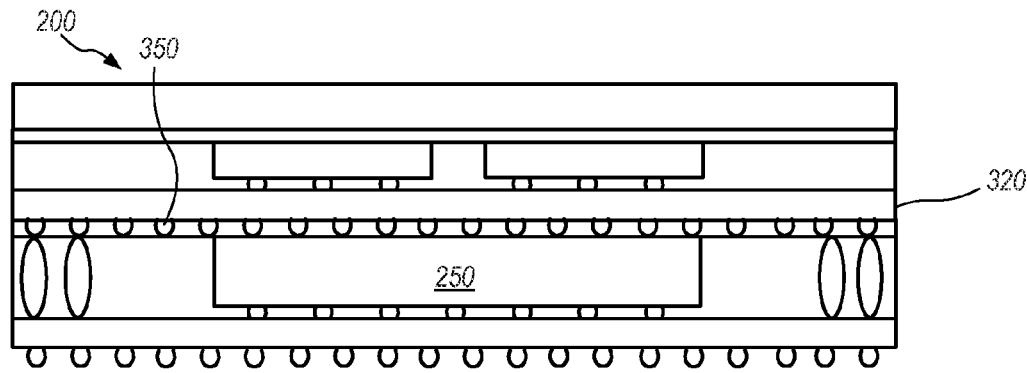

In some embodiments, a method may include directly bonding the third substrate 320 to the first die 250 using fourth set of electric conductors 350 (e.g., as depicted in FIG. 5C-D).

EMI Shielding

In order to address problems associated with electromagnetic interference discussed herein, in some embodiments, an EMI shield is applied (e.g., directly) to a PoP. Applying a shield directly to a wafer level fan-out PoP may result in extremely thin SOC and memory packages.

Figure 6:
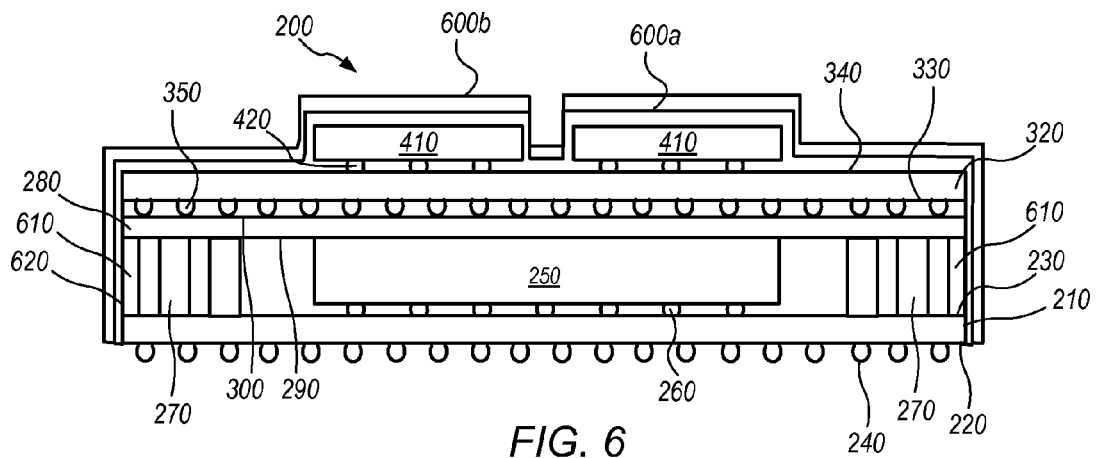
FIG. 6 depicts an embodiment of a package on package format including two redistribution layers and an EMI shield. At least some of the electrical conductors are not depicted for the sake of clarity.

FIG. 6 depicts an embodiment of a package on package format 200 including two redistribution layers (e.g., 280 and 320) and an EMI shield 600. At least some of the electrical conductors are not depicted for the sake of clarity. In some embodiments, a semiconductor device package assembly 200 may include a first substrate 210. The first substrate may include a first surface 220 and a second surface 230 substantially opposite of the first surface. In some embodiments, the first surface 220 may be equivalent to a lower surface of the semiconductor device package assembly. The first substrate may include a first set of electrical conductors 240 coupled to the first surface. The first set of electrical conductors may function to electrically connect the semiconductor device package assembly.

In some embodiments, the semiconductor device package assembly may include at least one electrical conductor 610. In some embodiments, the electrical conductor may be electrically coupled such that during use the electrical conductor is electrically grounded. In some embodiments, the electrical conductor may be electrically coupled to the first substrate such that during use the electrical conductor is electrically grounded. In some embodiments, the electrical conductor may be such that at least one of the electrical conductors exposes through a perimeter surface 620 of package format 200. In some embodiments, only a small portion of the electrical conductor 610 may exposed through the perimeter surface 620 of package format 200. In some embodiments, almost an entire length of the electrical conductor 610 may exposed through the perimeter surface of the package 200.

In some embodiments, the exposed electrical conductor may include a copper elongated member or post.

In some embodiments, the semiconductor device package assembly may include a first die 250. The first die may be electrically connected to the second surface 230 of the first substrate 210 using a second set of electrical conductors 260. In some embodiments, the semiconductor device package assembly 200 may include an electronic memory module 410 coupled to the first die 250.

In some embodiments, the semiconductor device package assembly may include a shield 600. Electromagnetic shielding reduces or inhibits the electromagnetic field in a space by blocking the field with barriers made of conductive or magnetic materials. The shielding may reduce the coupling of, for example, radio waves, electromagnetic fields and electrostatic fields.

The amount of reduction depends upon the material used, its thickness, the size of the shielded volume and the frequency of the fields of interest. The amount of reduction depends upon the size, shape and orientation of apertures in a shield to an incident electromagnetic field. Any holes in the shield or mesh must be significantly smaller than the wavelength of the radiation that is being kept out (or the shield will not effectively approximate an unbroken conducting surface).

In some embodiments, the shield comprises an electrically conductive material. The shield may be applied to an upper surface of the semiconductor device package assembly. The shield may be electrically coupled to at least one of the exposed electrical conductors. The shield may function to inhibit, during use, electromagnetic interference. In some embodiments, the exposed electrical conductor electrically grounds the shield. In some embodiments, the exposed electrical conductor is electrically coupled such that the shield is electrically grounded during use.

Typical materials used for electromagnetic shielding may include copper or nickel, in the form of very small particulates. The material may be sprayed on to the package assembly and, once dry, produces a continuous conductive layer of metal. The shielding layer may include aluminum, ferrite, carbonyl iron, stainless steel, nickel silver, low-carbon steel, silicon-iron steel, foil, conductive resin, and other metals and composites capable of blocking or absorbing EMI, RFI, and other inter-device interference. In some embodiments, the shield may include a non-metal material such as carbon-black or aluminum flake to reduce the effects of EMI and RFI. The shield may be deposited using an electrolytic plating, electroless plating, sputtering, physical vapor deposition ("PVD"), chemical vapor deposition ("CVD"), or other suitable metal deposition process. For non-metal materials, the shield may be applied by lamination, spraying, or painting.

In some embodiments, the shield 600 comprises a plurality of layers 600a-b (e.g., as depicted in FIG. 6). The shield comprises a plurality of layers comprising a permeability difference between adjacent layers. Layering using different materials with different properties may allow the shield to inhibit interference resulting from different wavelengths of radiation.

Figure 7:
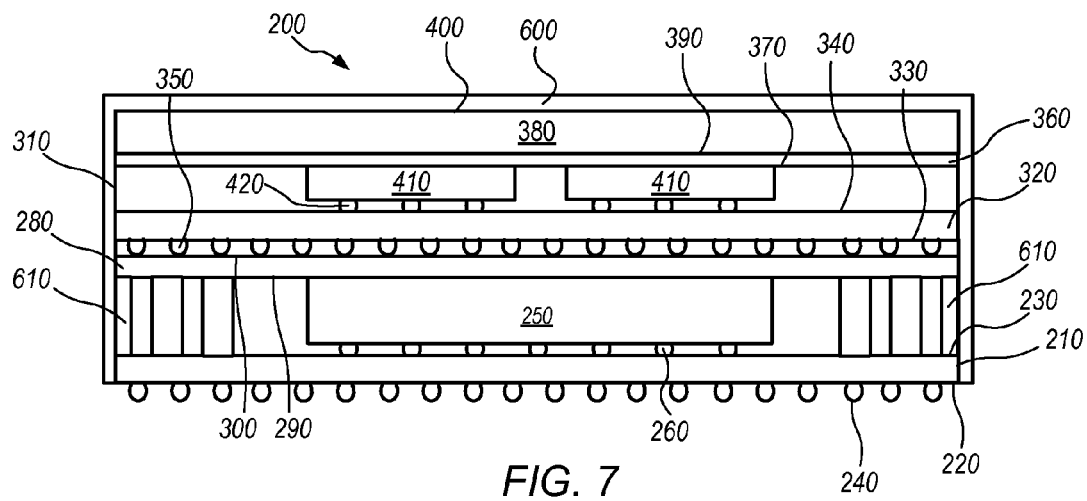
FIG. 7 depicts an embodiment of a thermally enhanced package on package format including two redistribution layers, a heat spreader, and an EMI shield. At least some of the electrical conductors are not depicted for the sake of clarity.
Figure 8:
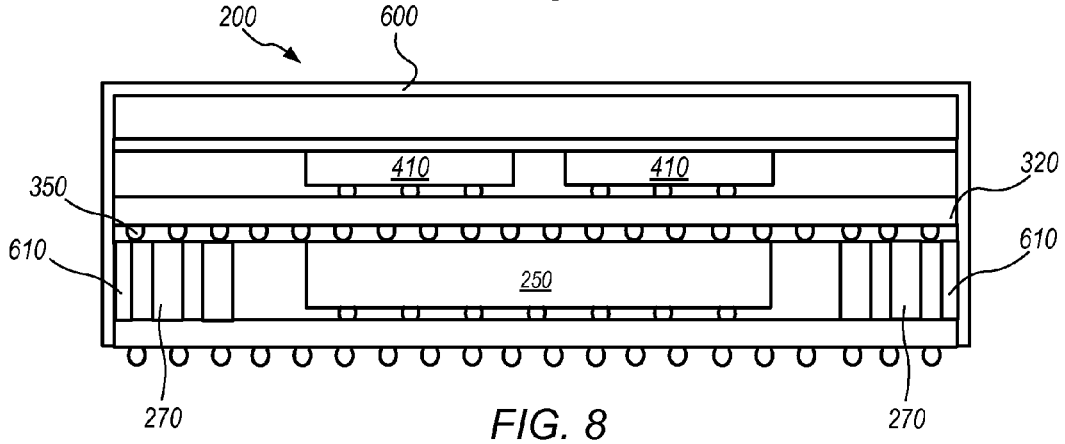
FIG. 8 depicts an embodiment of a thermally enhanced package on package format including one redistribution layer and an EMI shield. At least some of the electrical conductors are not depicted for the sake of clarity.

In some embodiments, the semiconductor device package assembly may include a thermally conductive material 360 directly applied to a second surface 370 of the electronic memory module. The semiconductor device package assembly may include a heat spreader 380 including a first side 390 and a second side 400 substantially opposite the first side. The first side may be directly bonded to the thermally conductive material. The heat spreader may function to transfer heat from the first die and the electronic memory module through the heat spreader from the first side to the second side. FIG. 7 depicts an embodiment of a thermally enhanced package on package format 200 including two redistribution layers (e.g., 280 and 320), a heat spreader 380, and an EMI shield 600. At least some of the electrical conductors are not depicted for the sake of clarity. FIG. 8 depicts an embodiment of a thermally enhanced package on package format including one redistribution layer and an EMI shield. At least some of the electrical conductors are not depicted for the sake of clarity.

In some embodiments, the heat spreader 380 may be at least partially connected to shield 600. In many instances heat spreaders are formed from metals which are not only thermally conductive but electrically conductive as well. As such the heat spreader may be connected to the shield such that the heat spreader may function to enhance the EMI shielding. If the heat spreader is at least electrically coupled to the shield (or at least grounded in some other manner) then (depending upon what the heat spreader is formed from) the heat spreader may function as an EMI shield as well further enhancing the EMI shielding performance.

In some embodiments, shielded wafer level fan-out packages may be manufactured in a number of manner. FIGS. 9A-D depict an embodiment of an assembly of several package on package formats including EMI shields. FIG. 9A depicts a set of packages manufactured at the same time as a single unit 630. This may be done in order to decrease costs of manufacture. Multiple first dies 250 may be assembled together on a single substrate 210 with a first redistribution layer 280. Units 630 may include electrical conductors 270. In some embodiments, units 630 may be formed without FIG. 9B depicts a set of packages manufactured at the same time as a single unit 630 after second dies 410 mounted on second redistribution layers 320 are coupled to unit 630. Second dies 410 may be mounted in a fan-out configuration in order to reduce the profile or Z height. In some embodiments, second dies 410 may form an electronic memory module. In some embodiments, units 630 may be formed without first redistribution layer 280 and second dies 410 mounted on second redistribution layers 320 may be coupled to first dies 250.

FIG. 9C depicts a set of packages 200 which have been singulated from a single unit 630. Singulation (e.g., saw singulation) cuts a large set of packages into individual packages 200. Singulation may be conducted such that electrical conductors 270 are cut forming electrical conductors 610 which are at least partially exposed along the perimeter surface 620 of package 200. Electrical conductors 610 may be electrically coupled, for example, to substrate 210 such that the exposed electrical conductors are grounded during use.

FIG. 9D depicts a set of packages 200 which have been after a shield 600 has been applied the packages 200. The shield may inhibit interference (e.g., electromagnetic interference). The shield may include one or more layers. The shield may be deposited using electrolytic plating, electroless plating, sputtering, spray, physical vapor deposition ("PVD"), chemical vapor deposition ("CVD"), or other suitable metal deposition process. For non-metal materials, the shield may be applied by lamination, spraying, or painting. In some embodiments, the shield may be electrically coupled (e.g., grounded) during use. The shield may be electrically coupled to exposed electrical conductors 610. The shield may form a substantially continuous layer over the package and be coupled to the exposed electrical conductors 610 through direct contact.

Numerous variations and modifications will become apparent to those skilled in the art once the above disclosure is fully appreciated. It is intended that the following claims be interpreted to embrace all such variations and modifications.

What is claimed is:

1. A semiconductor device package assembly, comprising:
    a first substrate including a first surface, a second surface substantially opposite the first surface, and a first set of electrical conductors coupled to the first surface and electrically coupling the semiconductor device package assembly, wherein the first surface comprises a lower surface of the semiconductor device package assembly;
    at least one exposed electrical conductor of the first set of electrical conductors electrically coupled to the first substrate such that the at least one of the exposed electrical conductor is exposed through a perimeter surface of the semiconductor device package assembly;
    a first die electrically coupled to the second surface of the first substrate using a second set of electrical conductors, wherein the first die is electrically coupled to the second surface of the first substrate using the second set of electrical conductors such that the first die is directly bonded to the first substrate, wherein the second set of electrical conductors are electrically coupled to at least some of the first set of electrical conductors;
    a third set of electrical conductors coupled to the second surface of the first substrate, wherein the third set of electrical conductors are electrically coupled to at least some of the first set of electrical conductors;
    a second substrate comprising a first surface and a second surface substantially opposite of the first surface, wherein the first surface is directly bonded to a surface of the first die opposite the second set of electrical conductors;
    an electronic memory module coupled to the first die, wherein the electronic memory module comprises a third substrate comprising a first surface and a second surface substantially opposite of the first surface, wherein the first surface is directly bonded to the second surface of the second substrate using a fourth set of electrical conductors;
    a thermally conductive material directly applied to a surface of the electronic memory module;
    a shield applied to an upper surface of the semiconductor device package assembly, wherein the shield is electrically coupled to the at least one exposed electrical conductor, and wherein the shield inhibits, during use, electromagnetic interference; and
    a heat spreader comprising a first side and a second side substantially opposite the first side, wherein the first side is directly bonded to the thermally conductive material, wherein the heat spreader is configured to transfer heat from the first die and the electronic memory module through the heat spreader from the first side to the second side, and wherein the shield is applied to the second side of the heat spreader.

2. The assembly of claim 1, wherein the at least one exposed electrical conductor is electrically coupled to the first substrate such that the shield is electrically grounded.

3. The assembly of claim 1, wherein the at least one exposed electrical conductor electrically grounds the shield.

4. The assembly of claim 1, wherein the at least one exposed electrical conductor comprises a copper elongated member.

5. The assembly of claim 1, wherein the shield comprises an electrically conductive material.

6. The assembly of claim 1, wherein the shield comprises a plurality of layers.

7. The assembly of claim 1, wherein the shield comprises a plurality of layers comprising a permeability difference between adjacent layers.

8. The assembly of claim 1, wherein the electronic memory module comprises:
    at least one second die electrically connected to the second surface of the third substrate using a fifth set of electrical conductors such that the second die is directly bonded to the third substrate.

9. The assembly of claim 1, wherein the electronic memory module comprises:
    at least two second die electrically connected to the second surface of the third substrate in a fan out configuration using a fifth set of electrical conductors such that the second die is directly bonded to the third substrate.

10. The assembly of claim 1, wherein substantially no air gap is present between the electronic memory module and the second substrate.

11. The assembly of claim 1, wherein, during use, heat travels from the first die to the heat spreader without traversing an air gap.

12. The assembly of claim 1, wherein a Z height of the assembly is less than 1 mm.

13. The assembly of claim 1, wherein the first die is connected to the second surface of the first substrate using a flip chip configuration.

14. A method for shielding a semiconductor device package assembly, comprising:
    forming a first substrate comprising a first surface, a second surface substantially opposite of the first surface, and a first set of electrical conductors coupled to the first surface, wherein the first surface comprises a lower surface of the semiconductor device package assembly;
    electrically coupling the semiconductor device package assembly using the first set of electrical conductors;
    exposing at least one electrical conductor electrically coupled to the first substrate through a perimeter surface of the semiconductor device package assembly;
    coupling a first die to the second surface of the first substrate using a second set of electrical conductors such that the first die is electrically coupled to the first substrate;

electrically coupling the second set of electrical conductors to at least some of the first set of electrical conductors;

electrically coupling at least some of the first set of electrical conductors using a third set of electrical conductors coupled to the second surface of the first substrate;

directly bonding a first surface of a second substrate, substantially opposite of the first surface, to a surface of the first die opposite the second set of electrical conductors;

coupling a first surface, substantially opposite of a first surface, of a third substrate of an electronic memory module to the second surface of the second substrate of the first die using a fourth set of electrical conductors;

applying a thermally conductive material directly to a surface of the electronic memory module;

directly bonding a first side of a heat spreader to the thermally conductive material, wherein the heat spreader comprises a second side substantially opposite the first side;

transferring heat from the first die and the electronic memory module through the heat spreader from the first side to the second side of the heat spreader applying a shield to an upper surface of the semiconductor device package assembly; and electrically coupling the shield to at least one of the exposed electrical conductors, wherein the shield inhibits electromagnetic interference.

15. The method of claim 14, further comprising electrically coupling the exposed electrical conductor to the first substrate such that the shield is electrically grounded.

16. The method of claim 14, further comprising electrically grounding the shield using the exposed electrical conductor.

17. The method of claim 14, wherein the shield comprises a plurality of layers comprising a permeability difference between adjacent layers.

* * * * *